(12) United States Patent
Lung

(10) Patent No.: US 7,209,389 B2
(45) Date of Patent: Apr. 24, 2007

(54) TRAP READ ONLY NON-VOLATILE MEMORY (TROM)

(75) Inventor: Hsiang Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 272 days.

(21) Appl. No.: 10/771,023

(22) Filed: Feb. 3, 2004

(65) Prior Publication Data
US 2005/0169055 A1    Aug. 4, 2005

(51) Int. Cl.
*G11C 16/04* (2006.01)

(52) U.S. Cl. ................. 365/185.17; 365/185.01; 326/104

(58) Field of Classification Search ........ 365/185.17, 365/185.01; 326/104
See application file for complete search history.

(56) References Cited

U.S. PATENT DOCUMENTS

| | | | |
|---|---|---|---|
| 4,959,812 A | | 9/1990 | Momodomi et al. |
| 5,270,969 A | | 12/1993 | Iwahashi |
| 5,343,437 A | * | 8/1994 | Johnson et al. ........ 365/230.03 |
| 5,424,569 A | | 6/1995 | Prall |
| 5,511,020 A | * | 4/1996 | Hu et al. ............... 365/185.28 |
| 5,515,324 A | | 5/1996 | Tanaka |
| 5,586,073 A | * | 12/1996 | Hiura et al. ........... 365/185.01 |
| 5,644,533 A | | 7/1997 | Lancaster et al. |
| 5,691,552 A | * | 11/1997 | Oyama ..................... 257/316 |
| 5,768,192 A | | 6/1998 | Eitan |
| 5,774,400 A | * | 6/1998 | Lancaster et al. ........ 365/185.3 |
| RE35,838 E | | 7/1998 | Momodomi et al. |
| 5,953,254 A | * | 9/1999 | Pourkeramati ......... 365/185.26 |
| 6,011,725 A | | 1/2000 | Eitan |
| 6,172,907 B1 | | 1/2001 | Jenne |
| 6,215,148 B1 | | 4/2001 | Eitan |
| 6,307,807 B1 | * | 10/2001 | Sakui et al. ............. 365/238.5 |
| 6,436,768 B1 | | 8/2002 | Yang et al. |
| 6,458,642 B1 | | 10/2002 | Yeh et al. |
| 6,894,924 B2 | * | 5/2005 | Choi et al. ............. 365/185.01 |
| 2001/0048612 A1 | * | 12/2001 | Yi et al. ................ 365/185.17 |
| 2002/0179958 A1 | | 12/2002 | Kim |
| 2004/0130942 A1 | * | 7/2004 | Yeh et al. .............. 365/185.01 |

OTHER PUBLICATIONS

Liao et al., "Process Techniques and Electrical Characterization for High-k (HfOxNy) Gate Dielectric in MOS Devices", Proceedings, 7th International Conference on Solid-State and Integrated Circuits Technology, vol. 1, Oct. 2004, 372-377.*

(Continued)

*Primary Examiner*—Anh Phung
*Assistant Examiner*—Eric J. Wendler
(74) *Attorney, Agent, or Firm*—Mark Haynes; Haynes Beffel & Wolfeld LLP (57) ABSTRACT

A Trap Read Only Memory (TROM) architecture employs a NAND-type array structure configured as a read-only memory that is programmed only one time. The memory cells in the array comprise a gate terminal, a first channel terminal (source/drain), a second channel terminal (drain/source) and a channel region between the first and second channel terminals. A charge trapping structure, such as a layer of silicon nitride, is formed over the channel region. A tunneling dielectric is placed between the channel region and the charge trapping structure, and a blocking dielectric is placed between the charge trapping structure and the gate terminal. An E-field assisted (Fowler-Nordheim FN) tunneling program algorithm is applied.

29 Claims, 7 Drawing Sheets

OTHER PUBLICATIONS

De Blauwe, Jan, "Nanocrystal Nonvolatile Memory Devices," IEEE Transactions on Nanotechnology, vol. 1, No. 1 (Mar. 2002) 72-77.

Lee, Jae-Duk, "Effects of Floating-Gate Interference on NAND Flash Memory Cell Operation," IEEE Electron Device Letters, vol. 23, No. 5 (May 2002), 264-266.

Lee, Changhyun, et al., "A Novel Structure of SiO2/SiN/High k Dielectrics, Al2O3 for SONOS Type Flash Memory," Extended Abstracts of the 2002 International Conference on Solid State Device and Materials, Nagoya (2002), 162-163.

Shin, Yoocheol, et al., "High Reliable SONOS-Type NAND Flash Memory Cell with Al2O3 for Top Oxide," Non-Volatile Semiconductor Memory Workshop (2003) 2 pages.

Lee, Chang Hyun, et al., "A Novel SONOS Structure of SiO2/SiN/Al2O3 with TaN Metal Gate for Multi-Giga Bit Flash Memeries," IEEE (2003) 4 pages.

Chung, Steve S., et al., "A Novel Leakage Current Separation Technique in a Direct Tunneling Regime Gate Oxide SONOS Memory Cell," IEEE (2003), 4 pages.

Hirose, M., "Challenges for Future Semiconductor Development," Advance Semiconductor Research Center, National Institute for Advanced Industrial Science and Technology, International Microprocess and Nanotechnology Conference, (Nov. 6, 2002), available at http://www.miraipj.jp/en/opendata/pdf/021106MNC.pdf. No Copy of Document Provided, Website has Document Locked, Can Only View on Internet.

Lancaster et al., "A 5V-Only EEPROM with Internal Program/Erase Control," ISSCC 83/Thursday, Feb. 24, 1983/Imperial Ballroom B/2:00 p.m., IEEE International Solid State Circuits Conference, 3 pages.

* cited by examiner

FIG. 6
PROGRAM BIAS

FIG. 7
READ BIAS

TRAP READ ONLY NON-VOLATILE MEMORY (TROM)

BACKGROUND OF THE INVENTION

1. Field of the Invention

The present invention relates to electrically programmable, non-volatile, read-only memory and integrated circuits including such memory, and more particularly to a memory cell structure and method of operation based upon charge trapping structures adapted for E-field assisted tunneling.

2. Description of Related Art

Electrically programmable non-volatile memory technologies are being adapted to many applications. The various technologies vary in the number of times that the memory cells can be programmed, the voltages required to achieve programming, and the number of bits of data stored in each memory cell. Also, an important consideration in determining whether to apply a particular memory technology is the manufacturing steps required to form the memory cells and supporting circuitry.

Memory technologies also vary according to the array architecture. One popular architecture is known as the NAND-type array. NAND arrays for flash memory use small cells, and operate at high speeds. However, as design rules have scaled down toward 70 nanometers, and below, floating gate type NAND flash memory becomes impractical due to poor endurance, and parasitic capacitance between adjacent floating gates which deteriorates the cell threshold voltage distribution. On the other hand, the so-called SONOS type NAND flash memory has been explored, which is based on charge trapping silicon-oxide-nitride-oxide-silicon (SONOS) memory cells. The SONOS type NAND array is free of these technology issues below the design rule of 70 nm. The SONOS NAND flash memory is configured for programming by direct tunneling, requiring a tunnel oxide less than 30 nanometers thick for silicon dioxide based dielectrics. However, poor data retention and slow erase speed remain roadblocks for the application of the SONOS cell for high density NAND flash memory. SONOS-type cells have also been applied in the so-called NROM configuration, which employs hot-electron tunneling for programming, and hot hole injection for erase. The NROM cell has a very thick bottom oxide (greater than 70 Angstroms silicon dioxide equivalent thickness) in order to achieve acceptable data retention and endurance.

It is desirable to provide electrically programmable non-volatile memory cell technologies that can be implemented with very high density, and achieve long data retention, and can be made using processes more compatible with standard CMOS logic manufacturing techniques.

SUMMARY OF THE INVENTION

A Trap Read Only Memory (TROM) architecture is provided. Embodiments of the TROM employ a NAND-type array structure, making it easy to scale with smaller and smaller design rules and therefore suitable for very high-density memory. Embodiments of the TROM employ an E-field assisted (Fowler-Nordheim FN) tunneling program algorithm, and require only low voltage or ground biasing on the source/drain channel terminals of the cell while programming. A thicker tunneling oxide on the TROM cell gives better data retention than conventional SONOS NAND-type memory cell structures and the floating gate free cell structures. Embodiments of the TROM are configured as read only memory devices, such that the memory cells are programmed one time only, and there is no erase cycle. With no erase cycles, damage to the tunneling dielectric is avoided, and charge retention and read endurance performance is very good. As a result better data retention and better cell scalability are achieved, compared to conventional NAND flash memory or SONOS NAND-type memory.

The present invention is embodied by an integrated circuit that comprises an array of memory cells. The array is configured as a NAND array including a plurality of columns and rows of memory cells. The columns comprise one or more sets of memory cells in series coupled to a bit line, and the rows comprise sets of memory cells having their respective gate terminals coupled to a word line. The memory cells in the array comprise a gate terminal, a first channel terminal (source/drain), a second channel terminal (drain/source) and a channel region between the first and second channel terminals. A charge trapping structure, such as a layer of silicon nitride, is formed over the channel region. A tunneling dielectric is placed between the channel region and the charge trapping structure, and a blocking dielectric is placed between the charge trapping structure and the gate terminal. One embodiment comprises an Oxide-Nitride-Oxide ONO structure between the channel and the gate, where the three layers act as the tunneling dielectric, charge trapping structure and blocking dielectric, respectively.

The integrated circuit according to this embodiment of the invention includes circuitry to program memory cells in the array by E-field assisted tunneling from the channel region through the tunneling dielectric by applying a positive voltage to the gate terminal and a low voltage or ground to semiconductor bulk region in which the channel is formed, and to the first and second channel terminals. The tunneling dielectric has a barrier thickness relative to the semiconductor substrate that is sufficient to prevent direct tunneling. Thus, for a silicon dioxide based tunneling dielectric, the tunneling dielectric has a thickness greater than about 30 Angstroms. For other dielectric materials, the thickness can be characterized based on silicon dioxide equivalent thickness of about 30 Angstroms as well. In embodiments of the invention, the tunneling dielectric has a thickness that is less than about 70 Angstroms, and more preferably less than about 60 Angstroms. With a tunneling dielectric having a thickness between about 30 and about 70 Angstroms, E-field assisted tunneling can be efficiently accomplished on integrated circuit with reasonable voltages, without requiring other charge carrier energy boosting techniques, such as applied for hot electron programming.

When programming according to embodiments of the invention, a positive bias is applied on the word line establishing a big electric field between the word line and the channel, for example 18V across 5 nm, and assisting the electron tunneling into the trapping layer. The electric field causes the energy band to bend across the tunnel dielectric, so that its effective thickness is reduced enough to allow tunneling. Unlike SONOS-type NAND arrays, the tunnel dielectric has a thickness that is sufficient to prevent direct tunneling (greater than 30 Angstroms silicon dioxide equivalent thickness), improving data retention. Unlike the NROM array, the tunnel dielectric in the TROM is less than 70 Angstroms silicon dioxide equivalent thickness, and in some embodiments less than 60 Angstroms silicon dioxide equivalent thickness, allowing E-field assisted tunneling in practical program times and voltages, and improving scalability while retaining excellent data retention.

Circuitry is also included on the integrated circuit to read data from the memory cells in response to addresses by sensing the threshold voltages. In various embodiments of the invention, the memory cells are adapted for storing one bit per cell, and more than one bit per cell. For example, in embodiments of the invention, the amount of charge trapped in the charge trapping structure, and therefore the cell threshold voltage, can be controlled to establish two levels of charge (one bit of data) or four levels of charge (two bits of data), that can be sensed using known sense amplifier circuitry.

Embodiments of the invention are configured as a read only memory, which is programmable in the factory, or in the field, one time only, and readable many times. Embodiments of the invention provide a TROM array on a system-on-a-chip SOC configuration, with other memory types, including static random access memory, and other resources, such as general-purpose processors or field programmable gate array resources.

In other embodiments of the invention, memory cells as described above are implemented in small sets, used to store static information on integrated circuits, such as operating parameters, identifiers and the like.

The TROM cell size is about $4F^2$, where F is the minimum feature size for the manufacturing process, and therefore achieves very high density as design rules drop.

The present invention provides an electrically programmable, non-volatile memory cell, and integrated circuit devices employing the cell in arrays for read-only memory storage.

Other aspects and advantages of the present invention can be seen on review of the drawings, the detailed description and the claims which follow.

DETAILED DESCRIPTION

A detailed description of embodiments of the present invention is provided with reference to FIGS. 1–10.

Figure 1:
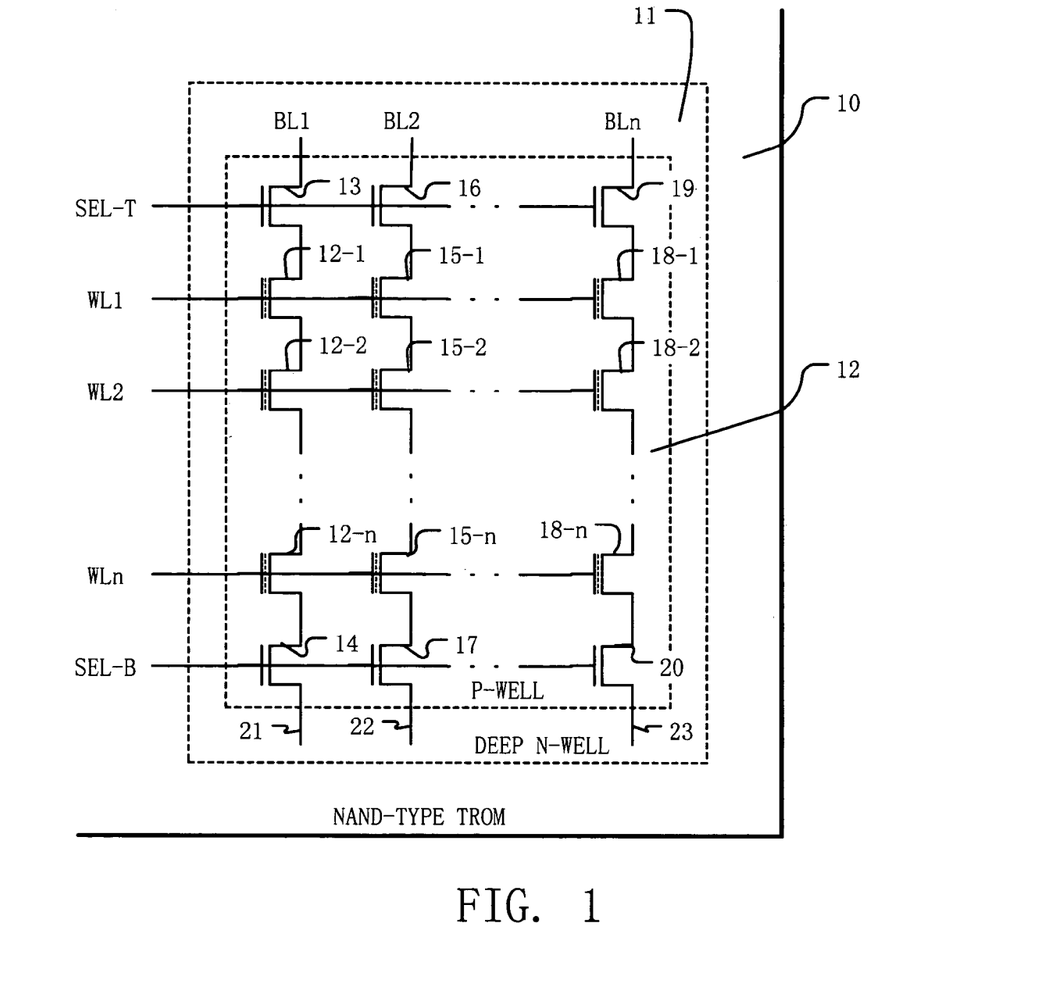
FIG. 1 is a simplified diagram of a NAND-type array, based on TROM cells according to the present invention.

FIG. 1 illustrates a basic NAND array architecture implemented with TROM cells according to the present invention. As shown in FIG. 1, the TROM NAND array comprises a plurality of memory cells configured in columns and rows. The columns comprise sets of memory cells that are arranged in series, and which have select transistors on one or both ends of the set for coupling the set of memory cells to bit lines. Thus, as shown in FIG. 1, a first bit line BL1 is coupled via a top select transistor 13 to a set of memory cells 12-1, 12-2, . . . 12-n connected in series. At the opposite end of the set of memory cells, a select transistor 14 is provided. The select transistors 13, 14 are responsive to decoded block select signals SEL-T at the top of the set, and SEL-B at the bottom of the set. The select transistor 13 typically connects directly to the bit line BL1, while the select transistor 14 may connect to a ground reference coupled to bias line 21 or to an adjacent bit line, depending on the decoding arrangement for the bit lines. Word lines WL1, WL2, . . . WLn are coupled to the gates of memory cells along respective rows in the array.

Likewise, bit line BL2 is coupled via the top select transistor 16 to a set of memory cells 15-1, 15-2, . . . 15-n connected in series in a second column of the array. Bottom select transistor 17 is coupled to the opposite end of the set of memory cells and to the bias line 22. The array repeats horizontally and vertically as shown with a final bit line BLn coupled via the top select transistor 19 to a set of memory cells 18-1, 18-2, . . . 18-n connected in series to a bottom select transistor 20. The bottom select transistor 20 is coupled to the bias line 23.

Embodiments of the invention are implemented on a substrate 10 of a single integrated circuit. The memory array is formed within an isolated p-type well 12, acting as the semiconductor bulk in which the channels of the memory cells are formed. The p-type well 12 is formed in a deep n-type well 11 in the substrate 10. The arrangement of isolation wells may be altered as desired. For example, the p-type well 12 may encompass only one segment of the array, many segments of the array, or all segments of the array.

Figure 2:
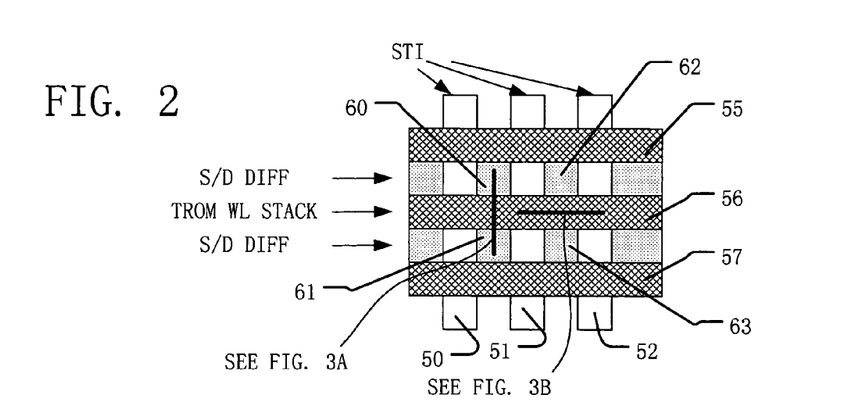
FIG. 2 shows a top view of a section of a memory array including TROM cells according to the present invention.

FIG. 2 illustrates one method for manufacturing a NAND-type TROM array according to the present invention. The process includes forming a plurality of lines 50, 51, 52 of shallow trench isolation STI structures in a semiconductor substrate. As mentioned with respect to FIG. 1, the region of the substrate in which the array is formed or in which segments of the array are formed are first prepared by providing a p-type semiconductor substrate, forming a deep n-type well in the substrate, and then forming an isolated p-type well within the n-type well. According to this embodiment, the STI structures are formed in the isolated p-type well. The plurality of lines 50, 51, 52 of STI structures is arranged in parallel in a first direction. A multilayer film (not shown), comprising a tunneling dielectric, a charge trapping structure, and a blocking dielectric is formed over the substrate in the STI structures. A plurality of word lines 55, 56, 57, typically comprising conductively doped polysilicon, other conductive material, or combinations of conductive material are formed over the multilayer film, and arranged orthogonally to the plurality of lines 50, 51, 52 of STI structures. The substrate, between the word lines 55, 56, 57, is implanted with n-type dopant to form source/drain diffusion regions. The implant step results in pockets (e.g.

60, 61, 62, 63) of conductive diffusion regions which act as the channel terminals for the memory cells in the array. According to this process, the memory cell size is 4F², taking full advantage of the minimum feature size F for the manufacturing process utilized.

Figure 3A:
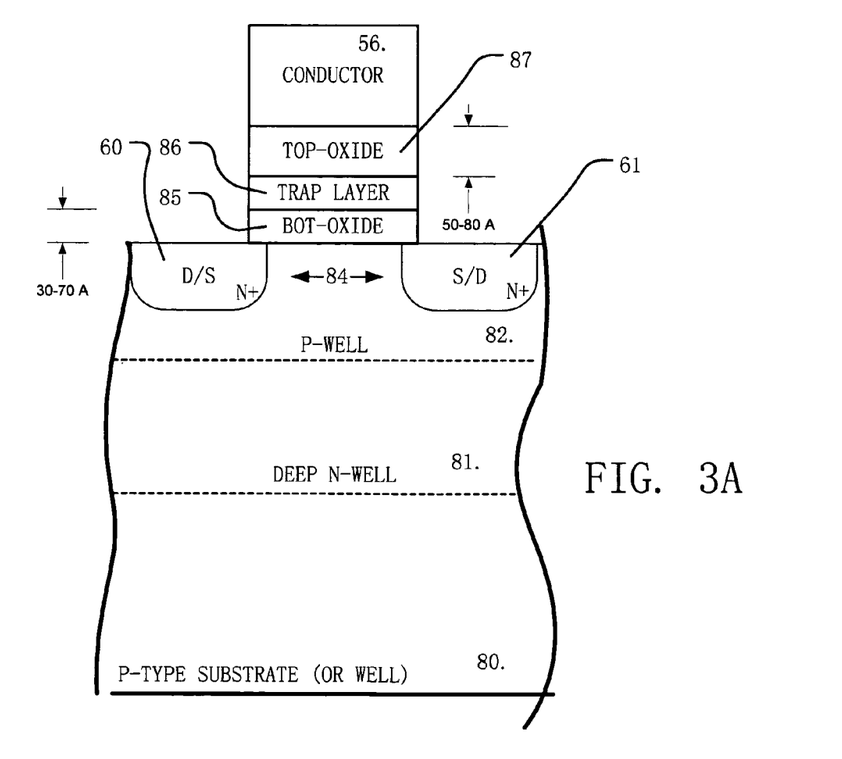
FIG. 3A is a cross-section view of a TROM cell, where the section is taken orthogonal to the word lines through the channel region of a memory cell according to the present invention.

FIG. 3A is a cross-sectional view taken on a line from channel terminal 60 to channel terminal 61 across the word line 56 of FIG. 2. The semiconductor substrate 80 includes a deep n-type well 81. The semiconductor bulk for the memory cell is formed in the isolated p-type well 82. Diffusion regions 60 and 61 are spaced apart with channel region 84 therebetween. The naultilayer film overlying the channel region 84 includes a bottom oxide 85, a trap layer 86, and a top oxide 87. Word line 56 overlies the multilayer film acting as a gate for the cell. As result, a memory cell with a first channel terminal 60, a second channel terminal 61, and a channel 84 therebetween is provided with a charge trapping structure (trap layer 86) between the channel 84 and the gate 56. The isolated p-type well is doped in embodiments of the present invention, so that the cell threshold with neutral charge in the charge trapping layer is slightly negative. In this manner, the channels in the memory cells are normally conductive reducing the impedance of the series connected set of memory cells and improving performance.

In embodiments of the present invention, the tunneling dielectric, charge trapping structure and blocking dielectrics are designed for E-field assisted tunneling for programming, and with recognition that the memory cell is configured as a read only memory cell, and will not be erased in preferred embodiments. In some embodiments the memory cells are erased a few times and selection of the blocking dielectric should be made with that in mind. The thickness of the trap nitride layer is about 20~90 Angstroms. The bottom oxide 85 has a thickness between about 30 and 70 Angstroms and the top oxide 87 has a thickness between about 50 and 100 Angstroms, in preferred embodiments of the invention. An electric field for E-field assisted tunneling can be established for example by applying 15~25V to the gate, and ground to the channel semiconductor bulk region in embodiments of the present invention having a tunneling dielectric oxide equivalent thickness of about 5 nanometers (50 Angtroms). Stress induced leakage current SILC induced data retention loss of TROM is much better than SONOS and NROM because the bottom oxide is not damaged by program and erase cycling. (Electron tunneling through the bottom oxide breaks the atomic bonds of the $SiO_2$, or $Si/SiO_2$ interface, and this causes the defects in the oxide that allow leakage). Furthermore, based on data retention experimental data, the TROM cell having a 54 Angstrom bottom oxide, suffers loss in threshold voltage Vt which fell within a window of less than 200 mV after a 10E6 second bake at 150° C. In contrast, Shin et al. report that SONOS NAND flash cells suffer loss due to SILC of about 2V after 10E6 sec. bake at 80° C. See, Shin, et al., *High Reliable SONOS-type NAND Flash Memory Cell with $Al_2O_3$ for Top Oxide*, Non-Volatile Semiconductor Memory Workshop, Monterey, Calif. (2003).

Figure 3B:
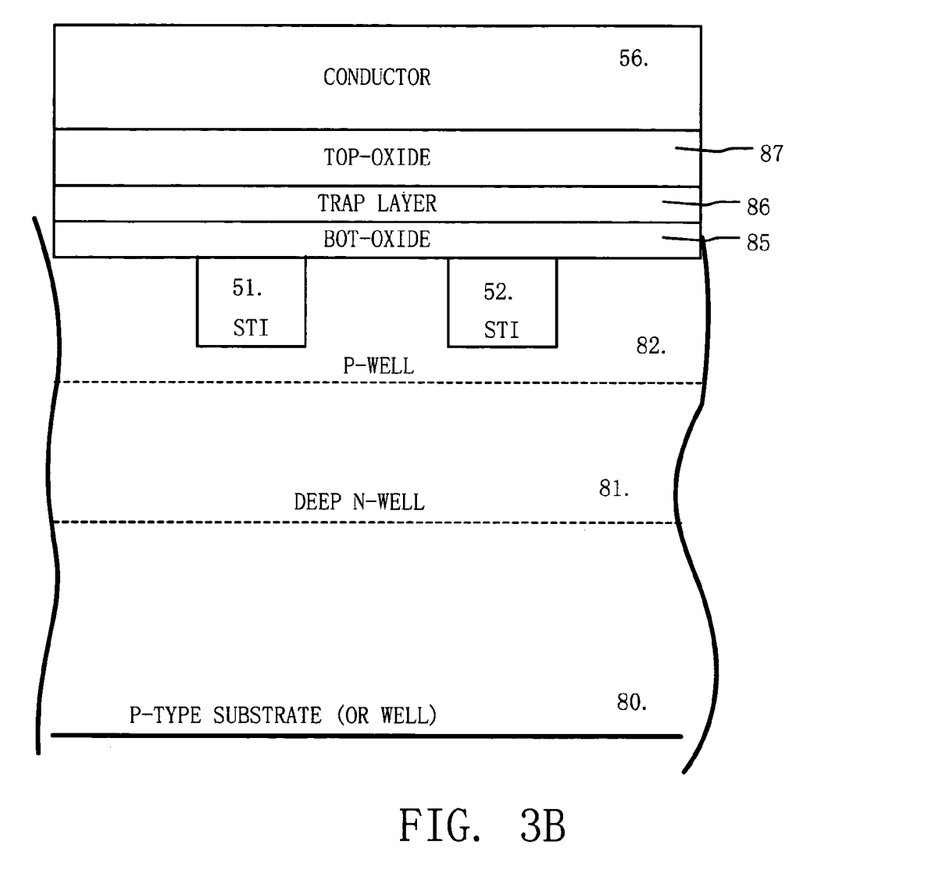
FIG. 3B is a cross-section view of a TROM cell, where the section is taken parallel to the word lines through the channel terminal regions of a memory cell according to the present invention.

FIG. 3B is a cross-sectional view taken on a line from STI structure 51 along the word line 56 to the STI structure 52 of FIG. 2. Structures shown in FIG. 3A are given the sane reference numerals as FIG. 3B. FIG. 3B shows the isolation provided by the STI structures 51, 52 between the channel regions. (e.g. 84) of the memory cells. Also, the multilayer film including bottom oxide 85, trap layer 86, and top oxide 87 extends along the line under the word line 56 in this embodiment. In other embodiments, the multilayer film may be limited to patches over the channel regions of the memory cells.

The charge trapping structure (trap layer 86) comprises a continuous layer of silicon nitride across the channel region in the illustrated example. In other embodiments, the charge tapping structure may comprise one or more isolated pockets of charge trapping material. Also, charge trapping materials other than silicon nitride may be utilized, including for example metal oxides such as HfOx, ZrOx, AlOx and others.

The tunneling dielectric (bottom oxide 85) may comprise silicon dioxide, silicon oxynitride, or other dielectric materials having a silicon dioxide equivalent thickness in the range of 30 to 70 Angstroms, such that the tunneling dielectric is thick enough to prevent direct tunneling and to provide suitable charge retention, and thin enough for reasonable program times using E-field assisted tunneling. Likewise, the blocking dielectric (top oxide 87) may comprise silicon dioxide, silicon oxynitride, or other dielectric materials selected for manufacturability, and suitability as blocking dielectrics.

As can be seen from the FIGS. 2, 3A and 3B, columns of memory cells are implemented which are arranged in series in a line parallel to the STI structures 50, 51, 52, sharing a diffusion region which acts as the source of one cell in the sequence, and the drain of the next cell in the sequence. Bit lines overlying the structure shown in FIG. 2 contact a diffusion region of a select transistor which is likewise arranged in series with first memory cell in a set of memory cells.

Figure 4:
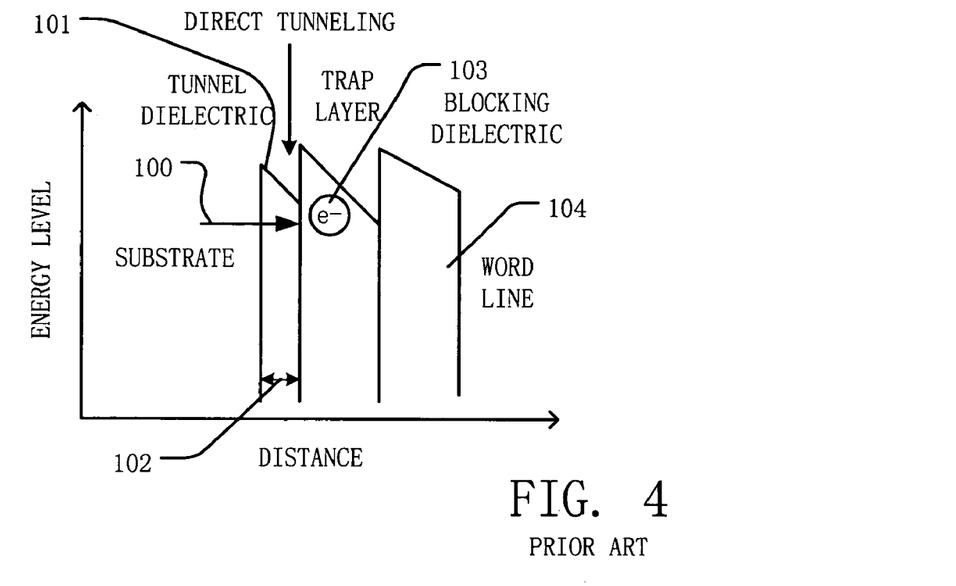
FIG. 4 illustrates an energy level diagram of prior art SONOS cells, which are adapted for direct tunneling.

FIG. 4 is a simplified energy level diagram illustrating direct tunneling, which is used in prior art SONOS NAND arrays. The semiconductor substrate has a conductive band represented by the level 100. The tunneling dielectric has a thickness 102 and an energy band represented by the line 101. For direct tunneling, electrons at the energy band 100 are able to penetrate the thickness of the tunneling dielectric without being excited to the energy band 101. For a silicon dioxide based tunneling dielectric, the thickness 102 at which direct tunneling is feasible is about 30 Angstroms or below. As shown in the diagram, after tunneling, electrons are trapped as represented by the symbol 103 in the trap layer of the structure. The blocking dielectric 104 is designed to have a thickness and conduction band energy level sufficient to prevent tunneling from the word line into the trap layer, and to prevent tunneling from the trap layer into the word line.

Figure 5:
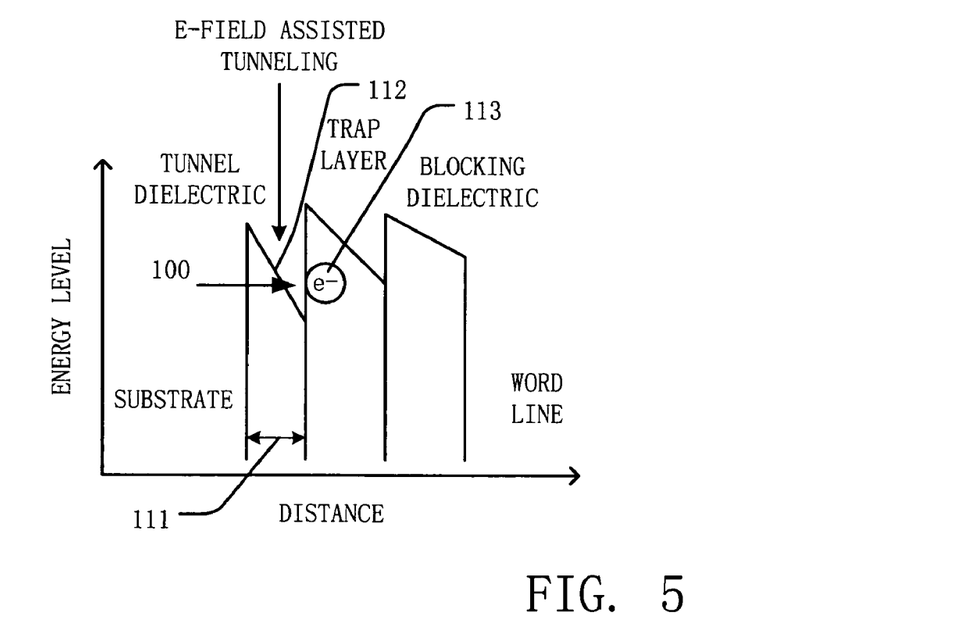
FIG. 5 illustrates an energy level diagram of a TROM cell, which shows a barrier and a thickness sufficient to prevent direct tunneling.

FIG. 5 is a simplified energy level diagram illustrating E-field assisted tunneling (also known as Fowler-Nordheim tunneling), as utilized in embodiments of the present invention. The semiconductor substrate has an energy band 100. The tunneling dielectric has a thickness 111 that is sufficient to prevent direct tunneling. However, with assistance of a large electric field, the energy band 112 through the tunneling dielectric is bent so that electrons at the energy level 100 are able to punch through and be trapped as represented by the symbol 113 in the charge trapping layer.

Figure 6:
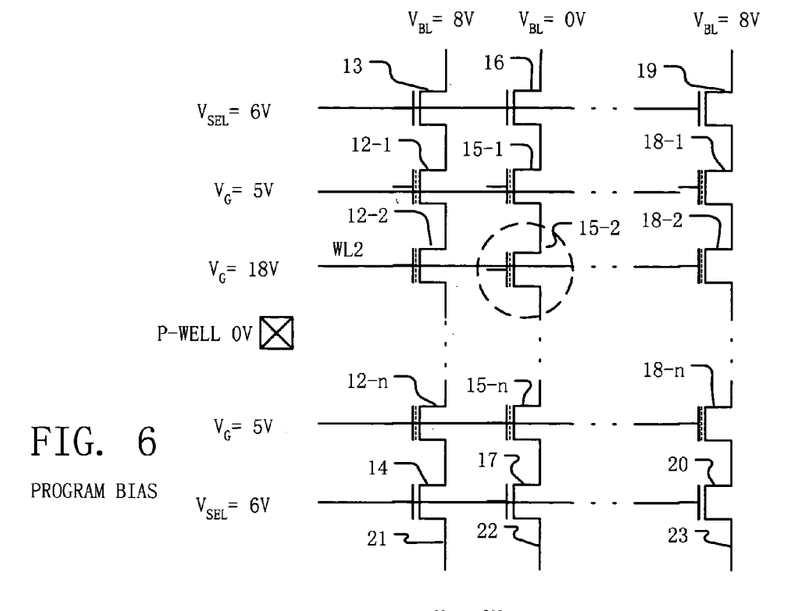
FIG. 6 illustrates a programming bias for a TROM array according to the present invention.

FIG. 6 illustrates a NAND array of TROM cells, like in FIG. 1, and a programming bias applied by circuitry on an integrated circuit for programming a selected memory cell (15-2) according to one representative embodiment of the invention. Of course, the bias voltages applied in a specific embodiment will be adapted as appropriate. The memory cells in FIG. 6 are given the same reference numerals as utilized in FIG. 1. For programming in this embodiment, circuitry applies a programming voltage pulse (or sequence of pulses) of about 18 volts to the word line WL2 coupled to the gate of memory cell 15-2. Circuitry applies a bit line voltage of ground (or low voltage) to the bit line BL2 coupled to the set of series connected memory cells including memory cell 15-2. Also, the isolated p-type well in which the channel of memory cell 15-2 is formed is applied a bias voltage of ground or low voltage. This biasing produces a large electric field between the channel and the gate of the memory cell being programmed, sufficient for E-field assisted tunneling so that electrons build up in the charge trapping structure increasing the threshold of the memory cell. The top select transistor and bottom select transistor receive a voltage of about six volts on their gates so that they are biased on and conductive. Unselected word lines receive a bias voltage of about five volts so that they are conductive, even if their threshold voltages have been increased by prior programming. Unselected memory cells on adjacent bit lines receive about eight volts on their bit lines. The electric field on unselected memory cells on adjacent bit lines therefore is relatively small compared to that of the selected memory cell. The electric field on unselected memory cells on the same bit line is likewise relatively small, compared to the voltages required for establishing an electric field for E-field assisted tunneling. The electric field on memory cells on the same word line as the selected cell 15-2 have an electric field caused by a voltage difference of about 10 volts, which is likewise insufficient to cause significant program disturbance for embodiments of the present invention.

Figure 7:
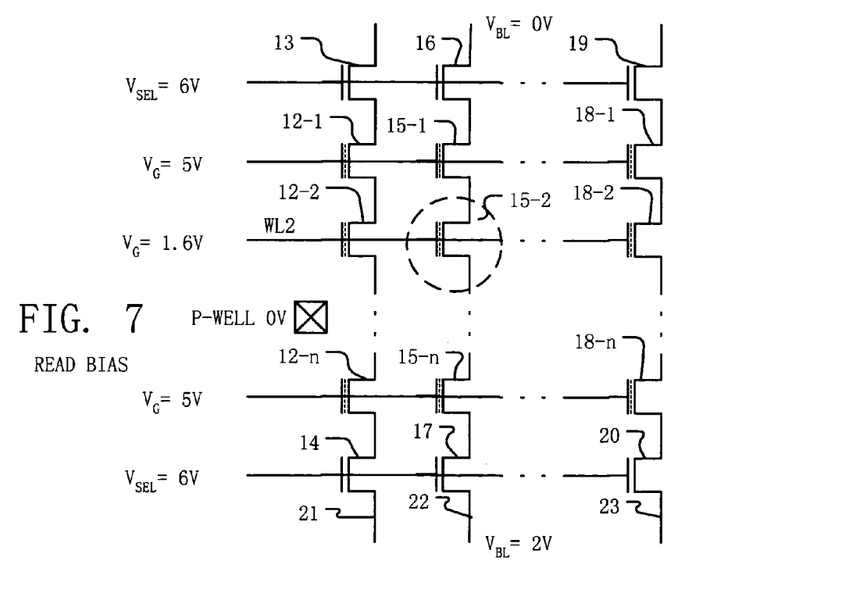
FIG. 7 illustrates a read bias for a TROM array according to the present invention.

FIG. 7 illustrates a NAND array of TROM cells, like in FIG. 1, and a read bias applied by circuitry on an integrated circuit for reading a selected memory cell (15-2) according to one representative embodiment of the invention. Of course, the bias voltages applied in a specific embodiment will be adapted as appropriate. The memory cells in FIG. 6 are given the same reference numerals as utilized in FIG. 1. For reading in this embodiment, circuitry applies a read voltage of about 1.6 Volts to the word line WL2 coupled to the gate of memory cell 15-2. Circuitry applies a bit line voltage of ground (or low voltage) to the top of the set of memory cells across bit line BL2, and about 2 volts on the bias line 22 at the bottom of the set of memory cells. Also, the isolated p-type well in which the channel of memory cell 15-2 is formed is applied a bias voltage of ground or low voltage. The top select transistor and bottom select transistor receive a voltage of about 6 volts on their gates so that they are biased on and conductive. Unselected memory cells on adjacent word lines receive a bias of about 5 volts on their gates so that they are conductive. Adjacent bit lines are floating or biased low. Thus, the set of memory cells in the column that includes memory cell 15-2 will conduct, unless memory cell 15-2 has a high threshold voltage.

Figure 8:
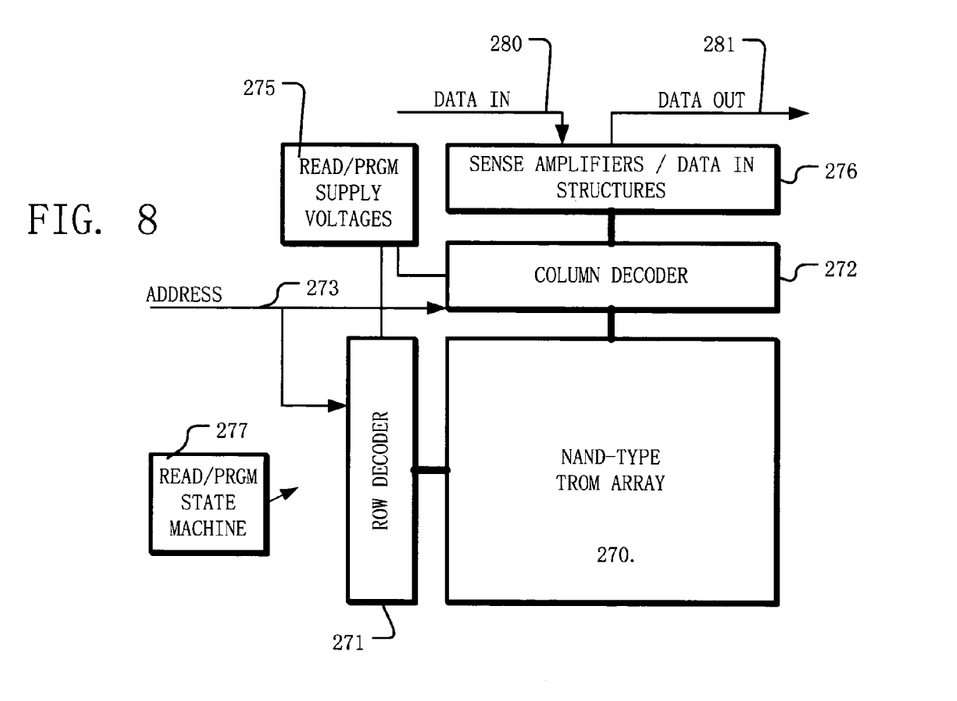
FIG. 8 is a simplified block diagram of the integrated circuit including a NAND-type TROM array according to the present invention.

A simplified block diagram of a memory device employing the TROM array 270 is shown in FIG. 8. The memory device includes a row decoder 271 and a column decoder 272, which are connected to an address bus 273. Supply voltages for read and program operations are supplied by voltage source 275, via the column decoder 272 and row decoder 271 to the selected memory cells in the array 270. Sense amplifiers and data-in structures 276 are coupled to the outputs of the column decoder 272, to input data bus 280 and to output data bus 281. A read and program state machine 277 is coupled to the components of the memory device. The state machine may be implemented by dedicated logic, by programmable logic array structures, by instructions executed by a general-purpose processor, or by a combination of such implementations.

Figure 9:
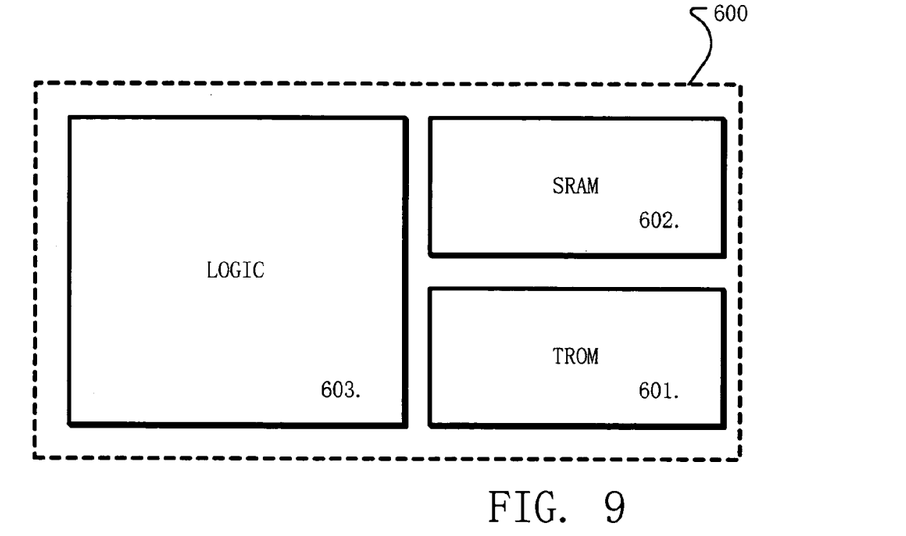
FIG. 9 is a simplified block diagram of an SOC chip architecture including a TROM array according to the present invention.

FIG. 9 illustrates an integrated circuit 600, including a TROM array 601, logic 603, such as application specific logic or programmable gate array logic, and a static random access memory SRAM 602. The TROM array 601 can be used to store more permanent data, such as program specifications for a programmable gate array and persistent control parameters. The SRAM 602 can be used to store working data used during operation of the logic 603.

Figure 10:
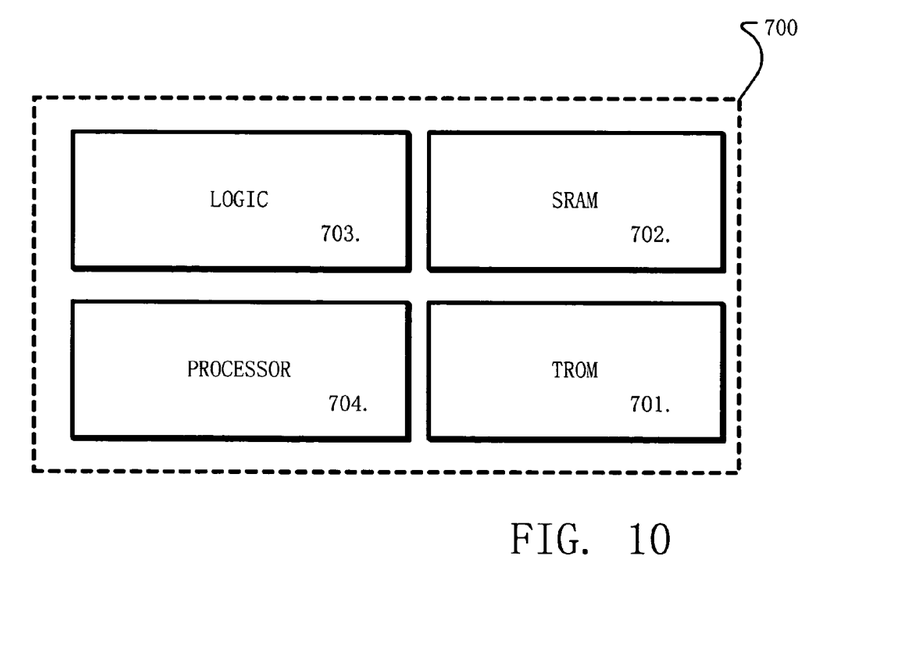
FIG. 10 is a certified block diagram of an alternative SOC chip architecture including a TROM array according to the present invention.

FIG. 10 illustrates another SOC embodiment of the invention. The integrated circuit 700 of FIG. 10 includes a TROM array 701, logic 703, such as application specific logic or programmable gate array logic, a static random access memory SRAM 702, and a general purpose processor 704. The TROM array 701 can be used to store programs of instructions for execution by the general purpose processor 704. In addition, instructions stored in the SRAM 702 by an external controller or transferred to the SRAM 702 from the TROM array 701, can be provided for execution by the processor to control the programming of the TROM array.

In summary, the present invention provides a novel nonvolatile memory named TROM. This invention discloses a novel read only memory technology TROM, including an array architecture, a cell structure, a programming method and a reading method. Advantages of the invention include that the architecture and cell structure are easy to scale compared to other charge trapping memory, including NROM and NAND floating gate technology. Also, the present invention achieves better data retention than NROM, SONOS flash and NAND flash. Furthermore, the cell size is smaller than NROM and than NAND floating gate technology. The cell data retention performance is excellent, making read-only memory configurations possible that are field programmable, compact and low cost, and that have large storage capacity.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   an array of memory cells, the array configured as a NAND array in a plurality of columns and rows of memory cells, the columns comprising one or more sets of memory cells in series couple to a bit line, and the rows comprising sets of memory cells having their respective gate terminals coupled to a word line, memory cells in the array respectively comprising a gate terminal, a first channel terminal, a second channel terminal and a channel region between the first and second channel terminals, a charge trapping structure over the channel region, a tunneling dielectric between the channel region and the charge trapping structure, and a blocking dielectric between the charge trapping structure and the gate terminal;
   circuitry to program the memory cells in the away by E-field assisted tunneling through the tunneling dielectric by applying a positive voltage to the gate terminal and a low voltage or ground to the first and second channel terminals, while limiting program and erase cycling; and
   circuitry to read data from the memory cells.

2. The integrated circuit of claim 1, wherein the tunneling dielectric has a barrier height and thickness sufficient to prevent direct tunneling.

3. The integrated circuit of claim 1, wherein the tunneling dielectric has a silicon-dioxide equivalent thickness between about 30 Angstroms and about 70 Angstroms.

4. The integrated circuit of claim 1, wherein the tunneling dielectric comprises silicon dioxide, and has a thickness greater than 30 Angstroms.

5. The integrated circuit of claim 1, wherein the tunneling dielectric comprises silicon dioxide, and has a thickness between about 30 Angstroms and about 70 Angstroms.

6. The integrated circuit of claim 1, wherein the positive voltage is about 15 Volts or greater.

7. The integrated circuit of claim 1, wherein the E-field is about 15 Volts over 5 nanometers, or higher.

8. The integrated circuit of claim 1, wherein said array of memory cells is configured as a read only memory.

9. The integrated circuit of claim 1, wherein memory cells in said array have a negative threshold voltage prior to programming.

10. The integrated circuit of claim 1, wherein memory cells in said array of memory cells are configured for one-time programming.

11. The integrated circuit of claim 1, including a static random access memory array, and logic which accesses data stored in said array of memory cells and the static random access memory array.

12. The integrated circuit of claim 1, including a static random access memory array, and a processor which executes instructions, including instructions for access to data stored in said array of memory cells, and stored in the static random access memory array.

13. The integrated circuit of claim 1, including a static random access memory array, and a processor which executes instructions, including instructions for access to data stored in said array of memory cells, and stored in the static random access memory array, and wherein said logic to program comprises instructions executed by the processor.

14. The integrated circuit of claim 1, wherein the charge trapping structure comprises silicon nitride.

15. The integrated circuit of claim 1, wherein the charge trapping structure comprises a metal oxide.

16. A read only memory veil, comprising:
a first channel terminal;
a second channel terminal spaced away from the first channel terminal by a channel, and wherein the channel is configured to have a negative threshold prior to programming;
a charge trapping structure;
a gate;
a blocking dielectric between the charge trapping structure and the gate; and
a tunnel dielectric between the channel and the charge trapping layer, wherein die tunnel dielectric has a barrier height and thickness sufficient to prevent direct tunneling, the memory cell adapted for one-time programming by applying a positive voltage to the gate and a low voltage or ground to the first and second channel terminals, and adapted for use as a read only memory.

17. An integrated circuit on a single substrate, comprising:
an array of memory cells configured as read only memory, the array configured as a NAND array in a plurality of columns and rows of memory cells, the columns comprising one or more sets of memory cells in series coupled to a bit line, and the rows comprising sets of memory cells having their respective gate terminals coupled to a word line, memory cells in the array respectively comprising a gate terminal, a first channel terminal, a second channel terminal and a channel region between the first and second channel terminals, a charge trapping structure over the channel region, a tunneling dielectric between the channel region and the charge trapping structure, and a blocking dielectric between the charge trapping structure and the gate terminal;
a plurality of word lines in the array contacting the gates of memory cells in respective rows in the array,
a plurality of bit lines in the array coupled to sets of memory cells along respective columns in the array;
an address decoder coupled to the plurality of word lines and the plurality of bit lines to address selected memory cells in the array;
logic, coupled to the plurality of word lines and the plurality of bit lines, to program the memory cells in the array B-field assisted tunneling of electrons to the charge tapping structure by applying a positive voltage to the gate terminal and a low voltage or ground to the first and second channel terminals, while limiting program and erase cycling; and
sense circuitry, coupled to the plurality of bit lines, to sense threshold voltages in selected memory cells in the array.

18. The integrated circuit of claim 17, wherein the tunneling dielectric has a silicon dioxide equivalent thickness between about 30 Angstroms and about 70 Angstroms.

19. The integrated circuit of claim 17, wherein the tunneling dielectric comprises silicon dioxide, and has a thickness greater than 30 Angstroms.

20. The integrated circuit of claim 17, wherein the tunneling dielectric comprises silicon dioxide, and has a thickness between about 30 Angstroms and about 70 Angstroms.

21. The integrated circuit of claim 17, wherein the positive voltage is about 15 Volts or greater.

22. The integrated circuit of claim 17, wherein the E-field is about 15 Volts over 5 nanometers, or higher.

23. The integrated circuit of claim 17, wherein memory cells in said array have a negative threshold voltage prior to programming.

24. The integrated circuit of claim 17, wherein memory cells in said array of memory cells are configured for one-time programming.

25. The integrated circuit of claim 17, including a static random access memory array, and logic which accesses data stored in said array of memory cells and the static random access memory array.

26. The integrated circuit of claim 17, including a static random access memory array, and a processor which executes instructions, including instructions for access to data stored in said array of memory cells, and stored in the static random access memory array.

27. The integrated circuit of claim 17, including a static random access memory array, and a processor which executes instructions, including instructions for access to data stored in said array of memory cells, and stored in the static random access memory array, and wherein said logic to program comprises instructions executed by the processor.

28. The integrated circuit of claim 17, wherein the charge trapping structure comprises a layer of silicon nitride.

29. The integrated circuit of claim 17, wherein the charge trapping structure comprises a metal oxide.

* * * * *

UNITED STATES PATENT AND TRADEMARK OFFICE
CERTIFICATE OF CORRECTION

PATENT NO. : 7,209,389 B2 Page 1 of 1
APPLICATION NO. : 10/771023
DATED : April 24, 2007
INVENTOR(S) : Hsiang-Lan Lung It is certified that error appears in the above-identified patent and that said Letters Patent is hereby corrected as shown below:

In claim 1, column 8, line 55, replace the word "away" with -- array --.

In claim 16, column 9, line 39, replace the word "veil" with -- cell --.

In claim 16, column 9, line 50, replace the word "die" with -- the --.

In claim 17, column 10, line 17, replace the word "B-field" with -- E-field --.

In claim 17, column 10, line 18, replace the word "tapping" with -- trapping --.

Signed and Sealed this

Eighteenth Day of September, 2007

JON W. DUDAS
*Director of the United States Patent and Trademark Office*